United States Patent [19]

Sedmak

[11] Patent Number: 4,471,484
[45] Date of Patent: Sep. 11, 1984

[54] SELF VERIFYING LOGIC SYSTEM
[75] Inventor: Richard M. Sedmak, Ambler, Pa.
[73] Assignee: Sperry Corporation, New York, N.Y.
[21] Appl. No.: 316,306
[22] Filed: Oct. 29, 1981

Related U.S. Application Data

[63] Continuation of Ser. No. 86,375, Oct. 18, 1979, abandoned.

[51] Int. Cl.³ ............................................. G06F 11/22
[52] U.S. Cl. .................... 371/27; 324/73 PC
[58] Field of Search ............... 371/27, 15; 324/73 PC, 324/73 AT

[56] References Cited

U.S. PATENT DOCUMENTS

| | | | |
|---|---|---|---|
| 3,815,025 | 6/1974 | Jordan | 371/27 X |
| 3,873,818 | 3/1975 | Barnard | 371/27 X |
| 4,001,818 | 1/1977 | Radichel et al. | 324/73 AT X |
| 4,066,882 | 1/1978 | Esposito | 371/27 X |
| 4,139,818 | 2/1979 | Schneider | 324/73 PC X |
| 4,180,772 | 12/1979 | Buelow et al. | 324/73 PC |
| 4,205,301 | 5/1980 | Hisazawa | 371/3 |

Primary Examiner—David H. Malzahn
Attorney, Agent, or Firm—Thomas J. Scott; Kenneth T. Grace; Walter B. Udell

[57] ABSTRACT

The invention provides internal self testing within an integrated circuit chip at all points along the logic chain. Internal stimulus generators and supervisory control circuits for the generators formed integrally within a VLSI chip are utilized together with integrally formed multiple fault detectors to provide self testing of the logic chain, mechanical interconnection failures, and power and clock pulse checking. The invention is utilizable in conjunction with either single or duplicate logic, which latter may be either duplicate complementary logic or duplicate functional logic. The multiple fault detectors provide a multiplicity of error signals which are multiplexed within the chip to produce encoded output error signals each of which designates the fault which has been detected within the chip. The invention eliminates the need for sophisticated ancillary test systems for diagnostic and go/no-go or confidence testing for hardware at the chip, board and system level. In a system these encoded error signals may be routed to error handling logic which receives encoded error signals from a large number of places, such as a group of chips or circuit cards, and by correlating the information contained in the encoded error signals is able to identify the source of the error as a particular VLSI chip, the interconnections between VLSI chips, a particular circuit card, a power supply line to a circuit card or a group of such cards, or other faults.

32 Claims, 7 Drawing Figures

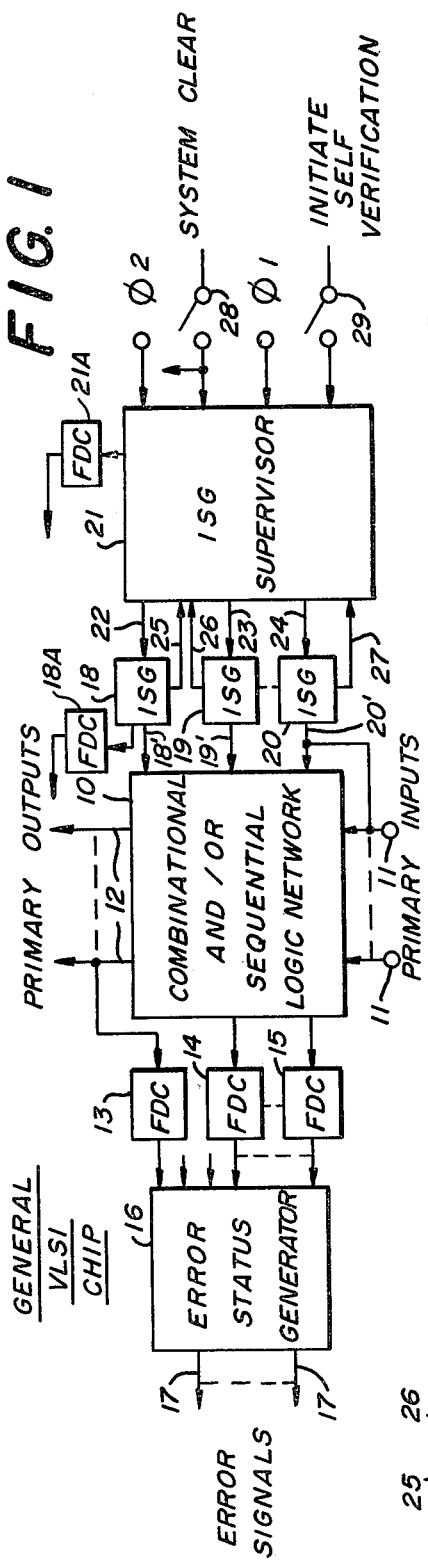

INTERNAL STIMULUS GENERATOR

DUPLICATE LOGIC VLSI CHIP

SELF VERIFYING LOGIC SYSTEM

This application is a continuation of application Ser. No. 086,375, filed Oct. 18, 1979 now abandoned.

This invention relates generally to fault detecting systems, and more particularly relates to fault detecting in VLSI chips, circuit boards carrying such chips and complete computer systems in which faults heretofore not successfully dealt with are detectable with a high degree of accuracy which permits rapid diagnosis of the source of the fault so that trouble shooting diagnosis and maintenance times are substantially reduced.

Computer systems have progressed in stages first from circuits made up individually of discrete circuit elements then to circuits made up of discrete basic logic structures such as gates and registers discretely interconnected by wiring techniques, and then to higher density circuits utilizing integrated circuit packages. Malfunctions in finished equipment arise from several areas, one area being defects in the individual components which make up the circuits, a second area being improper wiring or interconnection of the components, and the third area being failures which result in the components or wiring subsequent to manufacture of the finished assembly.

The testing of the components which go into the circuitry was a relatively simple matter with discrete items such as transistors and prepackaged counters and flip-flops. However, with the advent of integrated circuit packages containing quite a number of circuit components, as the density increased, the difficulty and expense of testing increased drastically until at the present time the cost of testing of a large scale integrated circuit package (LSI) by the manufacturer can exceed the cost of manufacture by a substantial margin. Equipment for testing some presently available integrated circuit packages is extremely expensive and at the same time is generally incapable of adequately testing all possible functional uses of such integrated circuit packages. Accordingly, components which appear to test properly can in fact fail in a particular application.

With the advent of very large scale integrated circuits (VLSI) containing in excess of five thousand gates per chip, the testing problem has become somewhat unmanageable. It is not economically feasible to test all possible combinations of logic through such a device because the cost of writing testing programs which can exercise all of the logic, and the time cost of actually carrying out such tests would be prohibitive. Moreover, with VLSI circuits the logic density per chip is so high that discrete access to all of the logic is impossible because of the limited availability of pin connections to the chip. For example, a ten thousand gate VLSI may have 130 input-output pins. However, this excess of logic capacity relative to access points makes it possible to utilize some of the logic capacity to provide fault checking inside of the chip by internally generating test signal routines at all desired points along the logic chain so that the occurrence of faults can be detected quickly in a chip, circuit board or in a system by a relatively fast check-out procedure in which all chips of a system self-verify simultaneously.

The basic concept of the present invention is the provision within each integrated circuit chip at various desired points along the internal logic chain of fault detecting circuits and of a plurality of signal generators and supervisory control circuits therefor integrally formed within the chip and selectably actuatable to generate desired signals necessary to exercise the logic by causing such signals to be processed through the processing logic and the fault detecting circuits. This provides the basis for substantially eliminating external testing of VLSI chips and circuit boards and the saving of very large amounts of money by dispensing with the need for extremely costly test equipment, the cost of developing test pattern data bases and programming the test equipment.

Additionally, when a computing system is assembled the power is turned on to make sure that it is ready for delivery to the customer, and what is done is to run confidence tests or "go/no-go" tests. Specifically, that is a battery of tests that can take several hours to run and at the end of which it is possible to determine that the system works. However, such tests are based on stimuli at the system level and not at the individual chip level, and all chips and interconnections in the system may or may not have gotten an exhaustive test. In contrast, in a system according to the invention, when the power is turned on, all the chips throughout the entire system self-verify simultaneously, in parallel, and also check the interconnections between and among themselves. It takes substantially less time and is much more exhaustive and much more thorough than what is accomplishable with a battery of generalized tests.

The use of multiple fault detectors and multiple stimulus generators formed internally within the chip can provide a multiplicity of error signals which are multiplexed within the chip to produce encoded output error signals each of which designates the fault which has been detected within the chip. These encoded error signals can then be routed to special error handling chips which receive encoded error signals from a large number of places, such as a group of chips or circuit cards, and by correlating the information contained in the encoded error signals are able to identify the source of the fault. Such sources might be identifiable as a particular VLSI chip, the interconnections between VLSI chips, a particular circuit card, a power supply line to a circuit card or a group of such cards, or other faults. Consequently, trouble shooting diagnosis of machine malfunctions is greatly simplified and maintenance time reduced. Accordingly, it is a primary object of the invention to provide a novel self testing system of fault detecting in devices using very large scale integrated circuit packages by utilizing integrated circuit chips structured to incorporate integrally therewithin test routine generating signal generators and fault detection circuits.

Another object of the invention is to provide a novel self-verifying fault detecting system as aforesaid in which both internal stimulus generation and fault detection are carried out internally within a VLSI chip at least at one intermediate point along the logic chain, and preferably at a plurality of intermediate points along the logic chain.

Still another object of the invention is to provide a novel self-verifying fault detecting system as aforesaid which contains internally its own test circuits for completely testing all system components and interconnections and requires no external test equipment for system checking.

A further object of the invention is to provide a novel self-verifying fault detecting system as aforesaid in which duplicate functional logic or duplicate complementary logic within the chip is utilized together with internal stimulus generators and multiple comparators to provide fault detection.

Another object of the invention is to provide a novel self-verifying fault detecting system in which separately encoded error signals are generated within a VLSI chip, which encoded error signals are utilized to identify with a high degree of particularity the sources of the particular faults which have been registered.

The foregoing and other objects of the invention will become clear from a reading of the following specification in conjunction with an examination of the appended drawings, wherein:

FIG. 1 is a functional block diagram of a single VLSI chip embodying the invention;

FIG. 2 is a functional block diagram of one form of the ISG Supervisor shown as a single block in FIG. 1;

In the several figures, like elements are designated by like reference characters.

Figure 3:
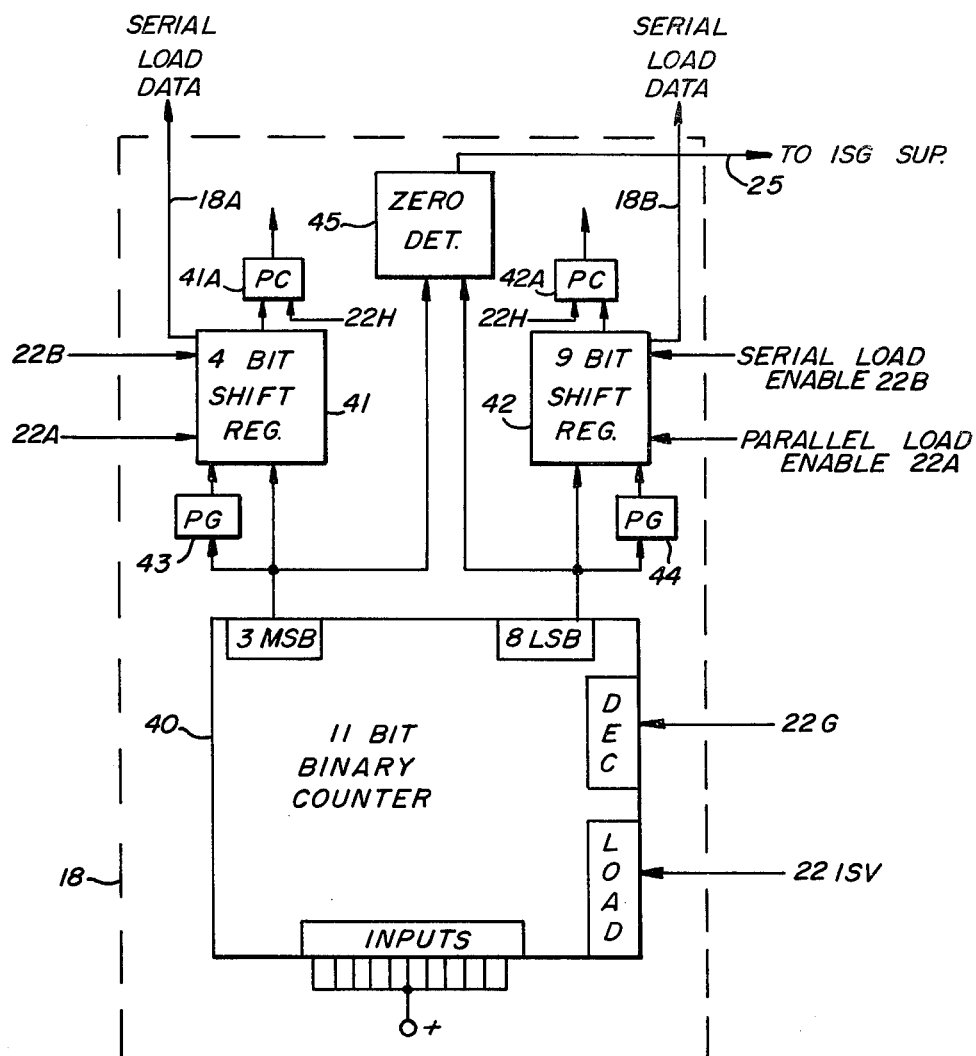
FIG. 3 is a functional block diagram of one form of the ISGs each shown as a single block in FIG. 1.

Turning now to the drawings, and first to FIG. 1, there is seen a functional block diagram of a VLSI chip, with all of the VLSI devices whch go to make up the invention illustrated in broad functional block form. The normal processing logic 10 is illustrated as having a vertical information flow moving from the primary inputs 11 through the network to the primary outputs 12. Outputs from the Logic Network 10 are taken to the Fault Detectors 13, 14 and 15 from selected points along the logic network, with the outputs of the fault detectors being routed to an Error Status Generator 16 where the various signals from the fault detectors are encoded according to various occurrence combinations to produce error signals at the output of the Error Status Generator 16 on the group of lines 17.

The Logic Network 10 could be any digital circuitry as found in any computer. The Fault Detectors 13, 14 and 15 could for example be parity checkers, comparators, residue code checkers, interval timers or any other of the many well-known checking circuits. The Error Status Generator 16 could typically be a function table encoding matrix, as are commonly used. While three fault detectors are illustrated, it should be understood that any appropriate number of fault detector circuits are utilizable in accordance with the best design criteria for the particular type of logic network with which such circuits are being utilized. One use of a fault detector circuit configuration as illustrated in elements 10 through 17 is fully described in the copending patent application of Harris L. Liebergot and Richard M. Sedmak, Ser. No. 915,838 entitled "Fault Detection and Isolation System" and assigned to the assignee of the present application. However, the system according to the present invention does not require the use of duplicate functional or complimentary logic, being completely usable with a single chain logic.

To the right of the Logic Network 10 are shown a plurality of Internal Stimulus Generators, ISGs 18, 19 and 20 which have outputs feeding into the Logic Network 10 at various points along the network. The output signals from the ISGs 18, 19 and 20 are respectively designated as being delivered to the Logic Network 10 by the multiple signal paths provided by each of conductor groups 18', 19' and 20'. These conductor groups will of course have a variable number of conductors dependent upon the type of ISG utilized. Additionally shown is a Fault Detector Circuit 18A which monitors ISG 18 for faults, and upon the detection of such, sends signals to Error Status Generator 16. ISGs 19 through 20 are also monitored by fault detector circuits (not shown) which perform a similar function for these ISGs. The ISGs and some of the network logic are controlled by signals received from the ISG Supervisor 21 over a group of signal lines 22, 23 and 24 which are representationally shown as single lines but which each constitute a conductor group. The signals generated by the ISGs are also returned to the ISG Supervisor via the lines 25, 26 and 27. While the ISGs are illustrated as three in number, it is to be understood that the actual number of ISGs utilized and their particular locations and connections to the Logic Network 10 will be determined by the nature and complexity of the particular logic network. A Fault Detector Circuit 21A monitors the ISG Supervisor 21 for faults, and upon the detection of such, sends signals to Error Status Generator 16. Inputs to the ISG Supervisor for illustrative purposes in the illustrated system are shown to the right of the ISG Supervisor 21 and consist of the clock pulse signals $\phi 1$ and $\phi 2$, a SYSTEM CLEAR signal representationally shown as being generatable by means of a switch 28, and an INITIATE SELF VERIFICATION signal illustratively shown as being initiatable by a switch 29. A functional block diagram of one particular possible type of ISG Supervisor is illustrated in FIG. 2, while a logic diagram of one particular possible type of ISG 18 is illustrated in FIG. 3.

Consider now FIG. 2 which illustrates one possible form of ISG Supervisor 21. Within the ISG Supervisor is a PROM (programmable read only memory) 30 which is "M" bits wide and "N" words deep, the particular makeup of the output "M" bits at any given time being controlled by the address sent to the PROM from the PROM Address Counter 31. The "M" bits associated with a particular address of the PROM 30 are held in a Control Register 32 as the output signals 22A to 22I illustrated in Table 1 subsequently to be described, and as the output signals on conductor groups 23 and 24. These signals are changed with the occurrence of each of the clock pulses $\phi 1$ after self verification has been initiated, as will be subsequently explained. Self verification is illustratively shown as being initiated by closure of switch 29 which generates the INITIATE S.V. signal, clearing the PROM Address Counter 31 and Control Register 32. This signal is also routed to the ISGs, being signal 22ISV sent to ISG18.

The Control Register 32 LOAD input is actuated by a signal from "and" Gate 33 when the latter receives a coincidence of the $\phi 1$ clock pulse and the SV signal from the Q output of D Flip Flop 34. The Q output arises when the "E" input of Flip Flop 34 is triggered by the trailing edge of the INITIATE S.V. signal. The SV signal or Q output from Flip Flop 34 is also directed to "and" Gate 35 which also receives inputs from the $\phi 2$ clock pulse and Inverter 36. The input signal to Inverter 36 is generated by "and" Gate 37 when there is a coincidence of zero detector signals occurring on ISG output lines 25, 26 and 27, this same output signal from "and" Gate 37 also being presented as one of the inputs to "and" Gate 38 which also receives the ∅2 clock pulse. The output of "and" Gate 38 is presented as one input to "or" Gate 39 which also receives an input signal from the System Clear Switch 28. Either signal into "or" Gate 39 produces an output signal to the "C" or CLEAR input of Flip Flop 34, which, when it occurs, terminates the Q state of the flip flop and the SV signal. One way of fault checking of the ISG Supervisor 21 illustrated in FIG. 2 could be by utilizing a parity checker as the Fault Detector Circuit 21A, parity check of the output lines 22A through 22H being provided by a parity check bit on line 22I. Parity checking may be examined or strobed by each ∅2 pulse. The operation of this particular ISG Supervisor 21 will be more fully explained in conjunction with an explanation of FIG. 4, but before turning to that figure, attention should be directed to FIG. 3 which illustrates the internal logic of ISG 18.

FIG. 3 illustrates one possible form that an ISG might take, and for purposes of illustration is to be considered as the ISG designated as 18 in the other figures of the drawings. The ISG includes an 11 Bit Binary Counter 40, the three most significant output bits of which are routed in parallel to a 4 Bit Shift Register 41 while the eight least significant output bits are routed in parallel to a 9 Bit Shift Register 42. The output bits of the Binary Counter 40 are also respectively routed to Parity Generators 43 and 44 and Zero Detector 45. Each of the parity generators generates a parity bit which is also appropriately inserted into the respective Shift Registers 41 and 42. The parallel outputs of Register 41 and Register 42 are examined for parity respectively by Parity Checker 41A and Parity Checker 42A, and upon detection of faults, signals are sent to Error Status Generator 16. Parity checking is strobed by the 22H signal. If checking of Counter 40 and Zero Detector 45 is desired, duplication and comparison could be utilized.

The Zero Detector 45 generates a positive logic high output on conductor 25 when the 11 Bit Binary Counter output has been decremented to zero.

The Shift Registers 41 and 42 are parallel loaded from the Eleven Bit Binary Counter 40 in the presence of a PARALLEL LOAD ENABLE Signal 22A received from the ISG Supervisor 21, while readout from the shift registers on lines 18A and 18B is a serial readout which takes place in the presence of SERIAL LOAD ENABLE Signal 22B from the ISG Supervisor 21. The 11 Bit Binary Counter is initially jammed to a state of all "ones" at the output when the Counter 40 LOAD input receives the 22ISV signal from the ISG Supervisor.

After the output of all "ones" from the 11 Bit Counter 40 has been processed through the logic, a 22G signal from the ISG Supervisor 21 is presented to the Decrement input of the Counter 40 thereby causing the count in the counter to be reduced by one, which changes the arrangement of the counter output bits. The decrementing process continues under control of the ISG Supervisor until the count in the Binary Counter 40 has been reduced to zero, whereupon this condition is detected by the Zero Detector 45 which sends a high signal back to the ISG Supervisor over line 25 to "and" Gate 37. When all of the ISGs have completed their routines, whatever they may be and however many stages they may take, all of the input signals to "and" Gate 37 in FIG. 2 will be high and will gate through to the input of Inverter 36 and "and" Gate 38. Inverter 36 then presents a low output to "and" Gate 35, effectively closing the gate so that no further incrementing of the PROM Address Counter 31 can occur. The occurrence of the next ∅2 clock pulse arriving at "and" Gate 38 is now gated through, and is gated through "or" Gate 39 to the "C" input of Flip Flop 34, thereby clearing the flip-flop and suppressing the Q state. This terminates the SV signal, which in turn closes down "and" Gates 33 and 35. As will be subsequently seen in connection with Table 1, the Decrement signal occurs at the end of a cycle, and the PROM Address Counter will be at an address such that all of the output signals from the Control Register 32 will be zeros, and the ISG and ISG Supervisor outputs will be such as to return the Logic Network 10 to its normal processing state. At this point, the ISGs are effectively locked out of interaction with the Logic Network 10.

Figure 4:
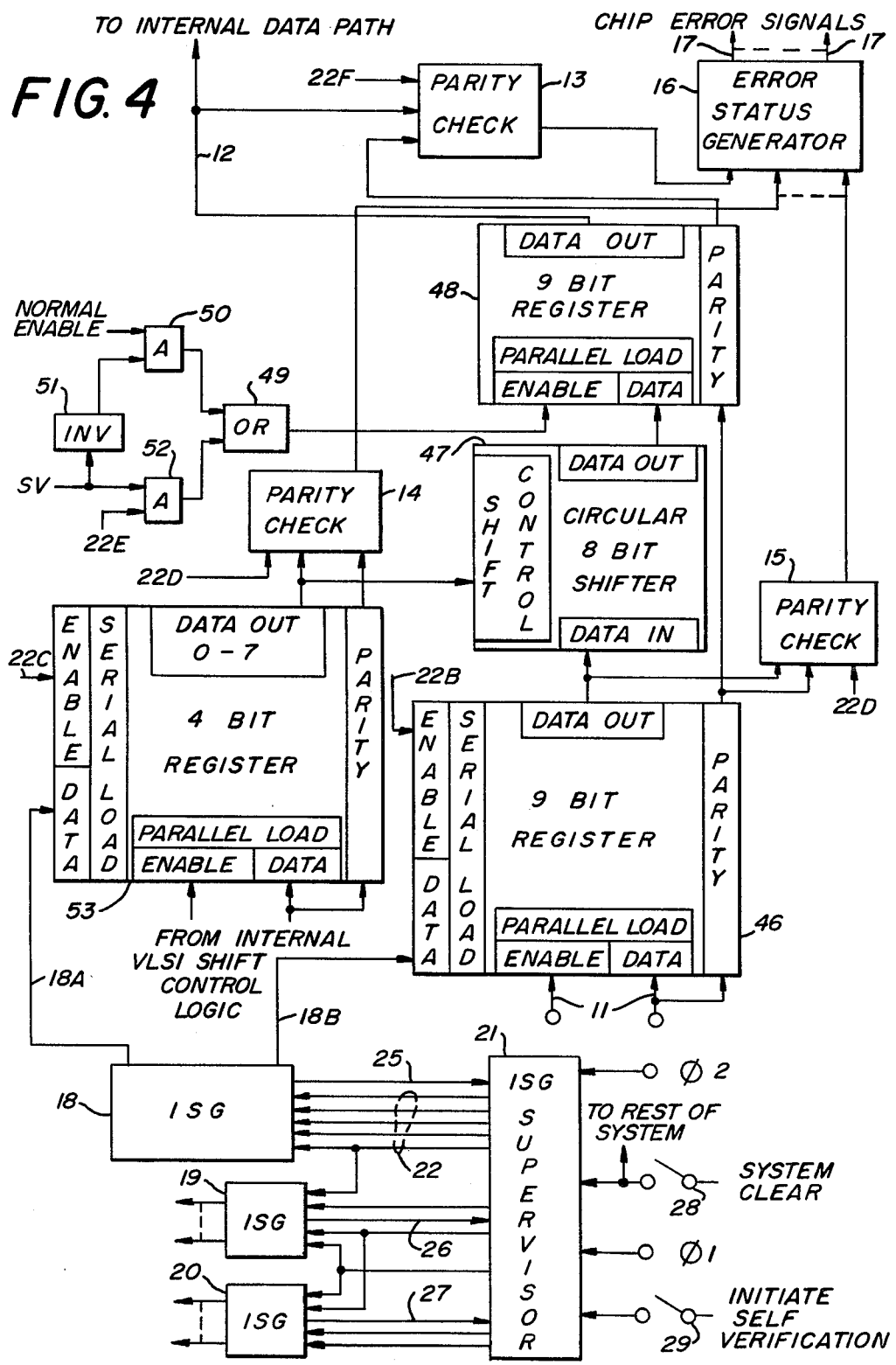
FIG. 4 is an expanded functional block diagram of FIG. 1 illustrating one form of the combinational and/or sequential logic network and FDCs each shown as a single block in FIG. 1.

Consider now FIG. 4, which is an expansion of FIG. 1, to illustrate a specific implementation of a portion of Logic Network 10 and the employment of Fault Detector Circuits 13, 14 and 15 as parity checkers. As shown, the primary inputs to the Logic Network 10 are connected to the Parallel Load inputs of a 9 Bit Register 46 which also includes a Serial Load mode into which data from the ISG 18 can be serially loaded from the ISG 9 Bit Shift Register 42 via line 18B when the Serial Load input is enabled by ISG Supervisor control signal 22B. The output of the 9 Bit Register 46 is presented to the input of 8 Bit Shifter 47 and also to Parity Check Fault Detector 15, the parity bit from Register 46 being also directed to the Parity Check Fault Detector 15 and to the parity bit input of 9 Bit Register 48. The output of the Circular 8 Bit Shifter 47 is routed to the input of the 9 Bit Register 48 which has its Enable Data control input controlled from "or" Gate 49.

The Normal Enable signal for 9 Bit Register 48, which is utilized in the normal operation of the logic, is presented to "or" Gate 49 from "and" Gate 50 which has its other input normally high from the output from Inverter 51 when the SV signal from the ISG Supervisor is low, that being when self verification is not in process. When self verification is in process so that the SV signal is high, it enables "and" Gate 52 and inhibits "and" Gate 50 through Inverter 51. The Normal Enable signal is thereby prevented from controlling 9 Bit Register 48, this control coming from "and" Gate 52 when the ISG Supervisor produces control signal 22E. The Shift Control for the 8 Bit Shifter 47 is produced by 4 Bit Register 53 which has its Parallel Load inputs connected to the outputs of another point in the logic chain within the VLSI. The Serial Load Data input of Register 53 is connected to the output of ISG 4 Bit Shift Register 41 via line 18A while having its Serial Load Enable circuits controlled by ISG Supervisor output signal 22C.

Figure 5:
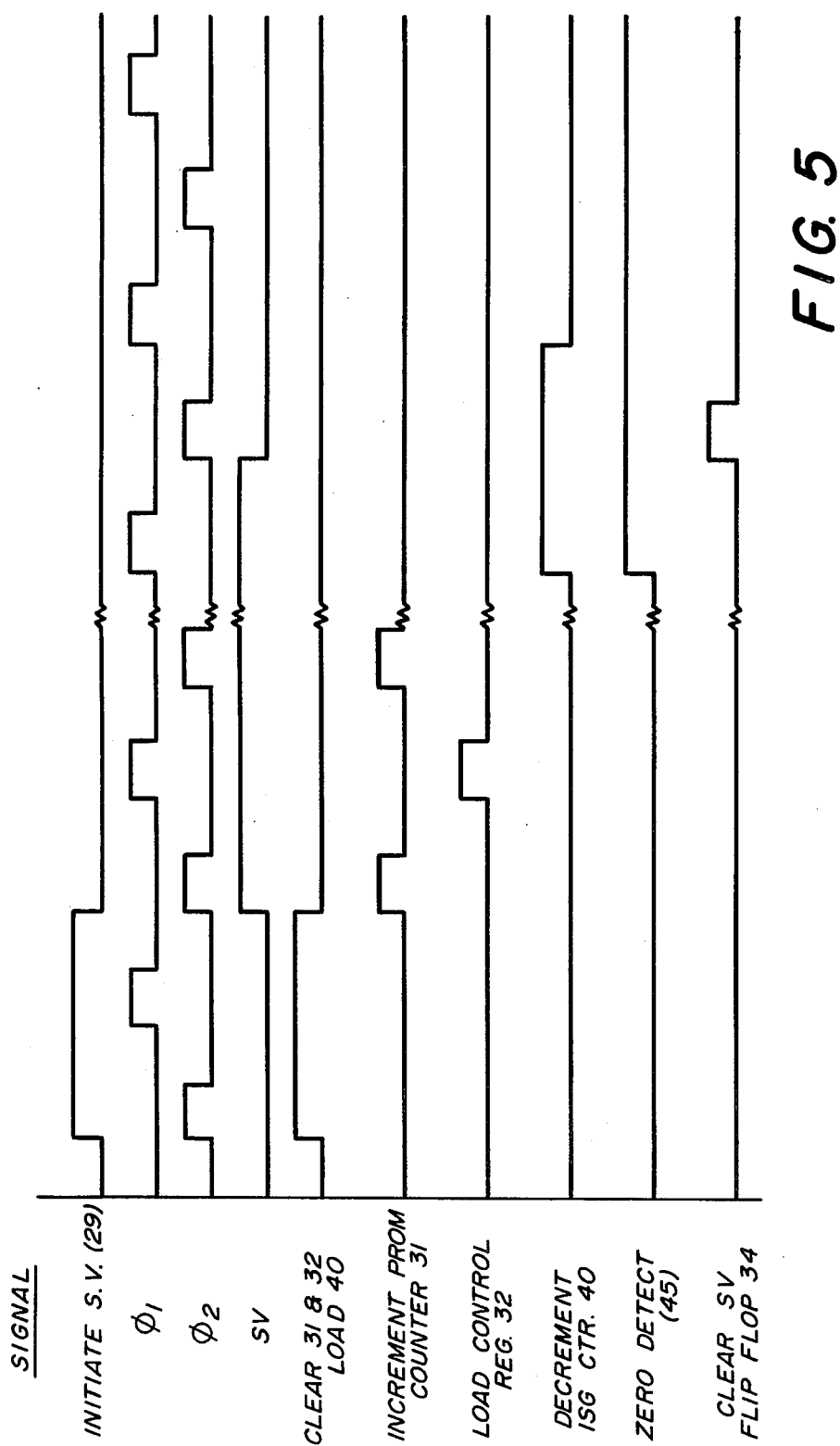
FIG. 5 is a waveform timing diagram for the implementation of the invention shown in FIGS. 2 to 4.

Referring now also to FIGS. 2, 3, 5 and Table 1, assume that the apparatus is to be turned on and that FIG. 4 represents a part of a single VLSI chip. Representational switch 28 is first momentarily closed to clear the system, the SYSTEM CLEAR signal passing to "or" Gate 39 and therethrough to the clear input "C" of D Flip Flop 34 thereby insuring that the flip flop is not in the Q state. With the system now cleared, representational switch 29 is now momentarily closed to generate the INITIATE SELF VERIFICATION signal which is transmitted to the CLEAR inputs of PROM Address Counter 31 and Control Register 32 to clear the Control Register and clear the PROM Address Counter to zero, and is also routed out of the ISG Supervisor as signal 22ISV to the LOAD input of 11 Bit Binary Counter 40 in ISG 18, thereby causing the latter to be set to a count at its outputs of all "ones". The outputs of Binary Counter 40 are presented to the inputs of the Shift Registers 41 and 42 in ISG 18 and to the Parity Bit Generators 43 and 44. However, this data is not entered into the shift registers until the Parallel Load Enable signal 22A is received from the ISG Supervisor.

As seen in the waveform timing diagram of FIG. 5, while the INITIATE SELF VERIFICATION signal cleared the PROM Counter 31 and Control Register 32 and loaded the ISG counter, it does not have any effect at the E input of Flip Flop 34 until its trailing edge appears. It is at this time that Flip Flop 34 is set to its Q state and the SV signal arises. The SV signal is transmitted to Inverter 51 to inhibit Gate 50 and is also transmitted to "and" Gate 52 to enable the latter, both as shown in FIG. 4. The SV signal together with the high output of Inverter 36 enables "and" Gate 35 to pass the next ∅2 clock pulse and increment the Prom Address Counter 31 to step it from its 0 Address to Address 1. Address 1 is shown in Table 1, and the designated conditions on the Control Register output lines 22A to 22I corresponding to Address 1 arise when the next ∅1 clock pulse is passed through "and" Gate 33 to the LOAD input of Control Register 32 to thereby transfer these "M" bits into the Control Register from the PROM 30.

TABLE 1

| PROM ADDRESS | PROM OUTPUTS 22 | | | | | | | | |
|---|---|---|---|---|---|---|---|---|---|
| | A | B | C | D | E | F | G | H | I |
| 0 | ←————— NOP —————→ | | | | | | | | |
| 1 | 1 | 0 | 0 | 0 | 0 | 0 | 0 | 0 | 1 |
| 2 | ←————— NOP —————→ | | | | | | | | |
| 3 | 0 | 1 | 1 | 0 | 0 | 0 | 0 | 1 | 1 |
| 4 | ←————— NOP —————→ | | | | | | | | |
| 5 | 0 | 1 | 1 | 0 | 0 | 0 | 0 | 0 | 0 |
| 6 | ←————— NOP —————→ | | | | | | | | |
| 7 | 0 | 1 | 1 | 0 | 0 | 0 | 0 | 0 | 0 |
| 8 | ←————— NOP —————→ | | | | | | | | |
| 9 | 0 | 1 | 1 | 0 | 0 | 0 | 0 | 0 | 0 |
| 10 | ←————— NOP —————→ | | | | | | | | |
| 11 | 0 | 1 | 0 | 0 | 0 | 0 | 0 | | 1 |
| 12 | ←————— NOP —————→ | | | | | | | | |
| 13 | 0 | 1 | 0 | 0 | 0 | 0 | 0 | 0 | 1 |
| 14 | ←————— NOP —————→ | | | | | | | | |
| 15 | 0 | 1 | 0 | 0 | 0 | 0 | 0 | 0 | 1 |

TABLE 1-continued

| PROM ADDRESS | PROM OUTPUTS 22 | | | | | | | | |
|---|---|---|---|---|---|---|---|---|---|
| | A | B | C | D | E | F | G | H | I |
| 16 | ←————— NOP —————→ | | | | | | | | |
| 17 | 0 | 1 | 0 | 0 | 0 | 0 | 0 | 0 | 1 |
| 18 | ←————— NOP —————→ | | | | | | | | |
| 19 | 0 | 1 | 0 | 0 | 0 | 0 | 0 | 0 | 1 |
| 20 | ←————— NOP —————→ | | | | | | | | |
| 21 | 0 | 0 | 0 | 1 | 0 | 0 | 0 | 0 | 1 |
| 22 | ←————— NOP —————→ | | | | | | | | |
| 23 | 0 | 0 | 0 | 0 | 1 | 0 | 0 | 0 | 1 |
| 24 | ←————— NOP —————→ | | | | | | | | |
| 25 | 0 | 0 | 0 | 0 | 0 | 1 | 0 | 0 | 1 |
| 26 | ←————— NOP —————→ | | | | | | | | |
| 27 | 0 | 0 | 0 | 0 | 0 | 0 | 1 | 0 | 1 |
| 28 | ←————— NOP —————→ | | | | | | | | |
| 29 | ←————— NOP —————→ | | | | | | | | |
| 30 | ←————— NOP —————→ | | | | | | | | |
| 31 | ←————— NOP —————→ | | | | | | | | |

NOP = ALL ZEROS

At Address 1 the 22A signal goes high and causes the respective outputs from the ISG Binary Counter 40 and Parity Bit Generators 43 and 44 to be parallel loaded into the 4 Bit and 9 Bit Shift Registers 41 and 42. The PROM Address Counter 31 now cyclically steps through the entire sequence of PROM addresses under control of clock pulse ∅2 which increments the Address Counter each time it subsequently occurs. After the Address Counter 31 is stepped to change the address in the Prom 30, the appearance of the next ∅1 clock pulse transfers the PROM output to the Control Register 32 to thereby change the conditions on the output control lines 22A to 22I. As seen in Table 1, all of the even addresses of the Prom 30 are designated NOP or ALL ZEROS which creates pulses and insures stabilization of the system before the next operation occurs. Understanding that this is what occurs, the progress of the checkout can be observed by following the sequence of PROM addresses.

When the PROM address has stepped to Address 3 the 22B and 22C signals are generated. Registers 46 and 53 are shown as being loaded serially in order that no additional stages of logic need be added to the normal data path. The 22B signal enables serial load of 9 Bit Register 46 and enables the data in the ISG Shift Registers 41 and 42 to be serially shifted one bit at a time out of the Registers on lines 18A and 18B to the Serial Load Data inputs of the logic network Registers 53 and 46 respectively. The 22C signal enables serial load of 4 Bit Register 43. Since only one bit can be shifted during each clock pulse, the 22C signal persists for four successive odd PROM addresses so that the four bits from ISG Shift Register 41 may be successively shifted into 4 Bit Register 53, after which the 22C signal returns to the zero state and no further shifting can occur from ISG Shift Register 41.

Similarly the 22B signal persists for nine successive odd PROM addresses so that the nine bits in ISG Shift Register 42 may be successively shifted into logic network Register 46. The data in the logic network Registers 46 and 53 being now complete, parity check is carried out at the next PROM address which is Address 21 causing the generation of the 22D signal which actuates the parity check in checkers 14 and 15, the outputs from these checkers being routed to the Error Status Generator 16.

The PROM Address 23 causes the generation of the 22E signal which is transmitted to "and" Gate 52 producing an output which is routed through "or" Gate 49 to the Enable input of 9 Bit Register 48 so that the data from the Circular Shifter 47 is entered into the 9 Bit Register 48. PROM Address 25 causes the 22F signal to be generated as a strobing signal which together with the data and parity output bits from Register 48 are presented to Parity Checker 13, the output of which is also routed to Error Status Generator 16. The outputs of all of the Parity Checkers are examined in the Error Status Generator 16 and appropriate Error Signals 17, if any, are generated for subsequent processing. This completes the checking of that segment of the illustrated Logic Network 10 with respect to the first output bit pattern from the ISG 18 which consists of all "ones".

It is now necessary to change the count in the 11 Bit Binary Counter 40 in ISG 18 and repeat the entire process. This occurs when the PROM Address Counter 31 is shifted to its next odd count, which is Address 27, thereby generating the 22G signal. The 22G signal is routed to the Decrement input of 11 Bit Binary Counter 40 of ISG 18 and thereby reduces the count at the output of the Counter 40 by a count of one. The next four PROM addresses are illustrated in Table 1 as being NOP since in the illustrated case the PROM would be a standard 32 word device. When the PROM Address Counter cycles back to Address 0 and then Address 1, the entire sequence already described is repeated. This sequence of events continues cyclically until the 22G signal decrements the count in the Binary Counter 40 to zero.

At this point the Zero Detector 45 detects this condition and sends a high signal back along Conductor 25 to ISG "and" Gate 37. The high at "and" Gate 37 on line 25 is not gated through unless there are also highs on lines 26 and 27 at the input of the "and" Gate 37. Since ISGs 19 and 20 may be structured differently than ISG 18, it may be that control signals are still being generated on some of their control lines 23 and 24 during PROM Addresses 28 through 31. When however they have completed their sequences and have also produced zero detection signals, the coincidence of all of these signals at "and" Gate 37 passes therethrough to Inverter 36 thereby producing a low at the input of "and" Gate 35 and closing the gate to further incrementing of the PROM Address Counter 31. Additionally, the "and" Gate 37 output enables "and" Gate 38 so that the next ∅2 clock pulse is gated through, and through "or" Gate 39 to clear Flip Flop 34 and suppress the SV signal, thus also inhibiting "and" Gate 33.

At this point the self verification of this particular VLSI chip has been completed. Other VLSI chips may take shorter or longer times or the same time to complete their self verifying. However, Error Signals 17 generated from the Error Status Generator 16 of each of the VLSIs will have been being processed during the verification procedure and failure indications will have been recorded as to type and location.

Figure 6:
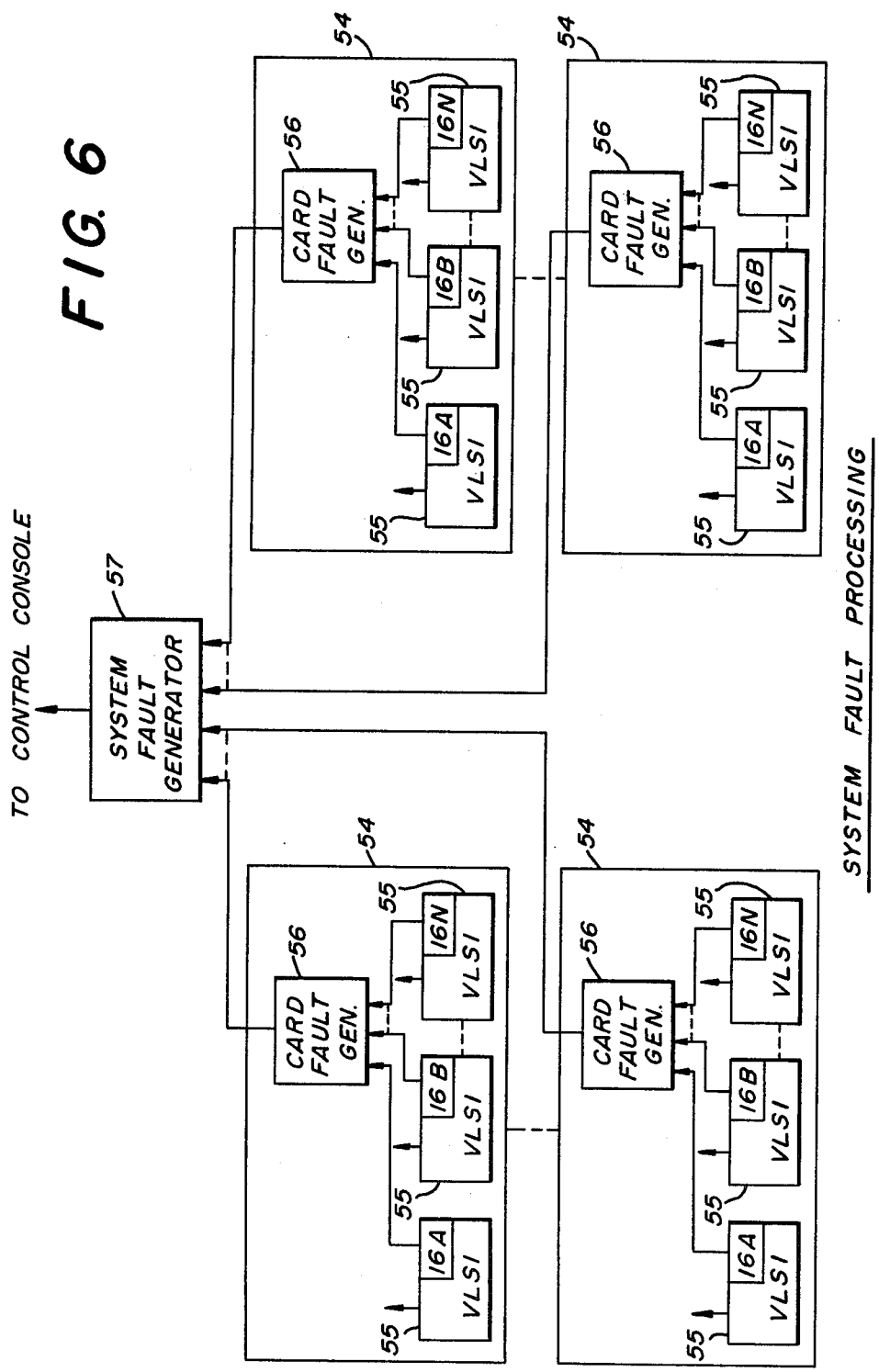
FIG. 6 illustrates the assemblage of self-verifying VLSI chips into a complete system for fault processing.
Figure 7:
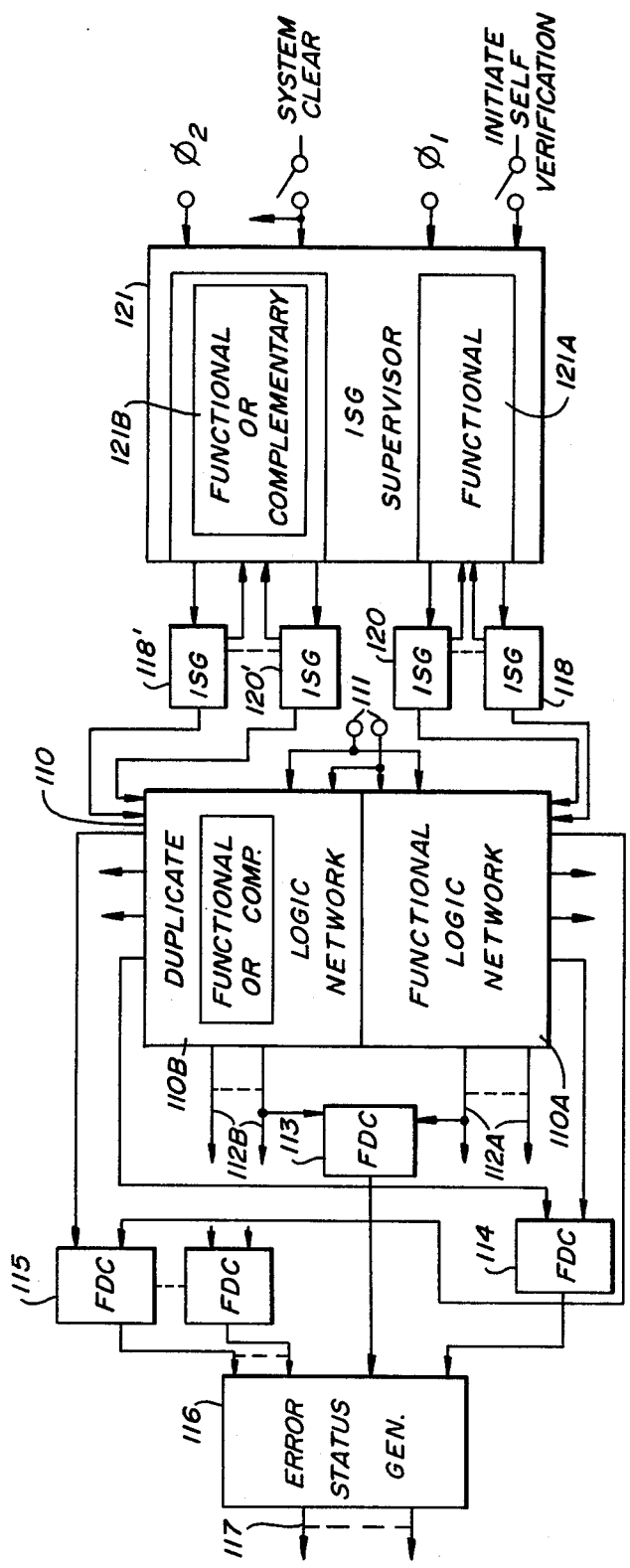
FIG. 7 illustrates the application of the invention to a duplicate logic VLSI chip.

An extension of the just described fault processing is illustrated in FIG. 6 which shows the manner in which such fault processing may be extended to an entire system. A plurality of Circuit Cards 54 are shown, each of which carries a plurality of VLSI chips 55. The VLSI chips on each card are of the same type as illustrated in FIG. 1, or FIG. 7 to be subsequently described, each including an Error Status Generator, which in FIG. 6 have been labelled as 16A and 16B through 16N. The output signal from each of the Error Status Generators 16 are routed for processing to a Card Fault Generator 56 which correlates the various signals from the different Error Status Generators and encodes the various combinations of signal occurrences to produce error signals at the output which represent detected faults in all of the VLSIs carried by that particular card, as well as the card wiring.

All of the signals from the assemblage of Card Fault Generators 56 are routed to a System Fault Generator 57 which in turn correlates the signals from all of the cards 54 and VLSIs 55. The Card Fault Generators 56 and System Fault Generator 57 may also be encoding function tables, or any other desired type of encoding system. The output signals from the System Fault Generator 57 are then routed to the System Control Console for display and/or recording in accordance with the nature of the detected faults.

FIG. 7 illustrates the invention as generally shown in FIG. 1 and as applied to the duplicate logic VLSI fault detection circuit configuration described in the aforementioned copending application of Harris L. Liebergot and Richard M. Sedmak entitled "Fault Detection and Isolation System". All of the elements shown in FIG. 1 are illustrated in FIG. 7, the same reference characters being preceded by the numeral 1. For example the Logic Network 10 shown in FIG. 1 is shown in FIG. 7 as the overall Logic Network 110 consisting of the Functional Logic Network 110A and the Duplicate Logic Network 110B, which latter may either be a duplicate of the Functional Logic Network 110A or may be duplicate complementary logic, all as set forth in the aforementioned copending patent application.

When duplicate logic is utilized for the Logic Network 110, the same system is employed for the ISGs and the ISG Supervisor. Accordingly, the ISG Supervisor 121 consists of a Functional Logic ISG Supervisor 121A and either a Functional or Complementary Logic ISG Supervisor 121B, the particular type of Supervisor 121B being the same as the type of logic used in Network 110B, that is, Functional or Complementary. Each of the ISG Supervisors 121A and 121B is organized with its own set of ISGs 118 through 120 and 118' through 120' respectively. The outputs of these ISGs are routed to the Logic Networks 110A and 110B as already described in conjunction with FIGS. 1 to 4.

Outputs are taken from multiple points within the Logic Networks 110A and 110B and are routed to an appropriate number of Fault Detector Circuits 113, 114 and the plural detectors 115, the outputs of which are fed to an Error Status Generator 116 which examines the received signals and encodes them to produce error output signals on lines 117. The Fault Detector Circuits 113 through 115 in addition to checking for faults solely within each of the Networks 110A and 110B, also check the operation of the two Logic Networks 110A and 110B against each other in order to insure that the same processing results are being produced by both networks at comparable logic points in the two Networks 110A and 110B. This is shown representationally in FIG. 7 by taking the outputs of the logic networks to a given fault detector circuit from the same point diagrammatically along the logic network. That is, it is observed that the logic network outputs at 112A and 112B are both compared in Fault Detector Circuit 113, while the inputs to Fault Detector Circuit 114 are observed representally to be taken from the same points along the processing chains in the Logic Networks 110A and 110B, and similarly for the inputs to Fault Detector Circuit 115.

It will be appreciated that the present invention is subject to various modifications and changes which may be made from time to time without departing from the essential spirit or general principles of the invention, and accordingly it is intended to claim the same broadly as well as specifically as indicated by the appended claims.

What is claimed to be new and useful is:

1. An electronic circuit including at least one integrated circuit chip comprising internally in combination
    (a) a data processing chain having an externally connectible input circuit and an externally connectible output circuit,
    (b) internal stimulus generator means having signal output circuits and control means coupled to and operable for activating said generator means to cause said generator means to produce a predetermined signal pattern at the said generator means signal output circuits,
    (c) internal stimulus generator supervisory control means having actuating means and control signals output means, said actuating means being coupled to said control signals output means and being effective when actuated to produce a sequence of control signals at said control signals output means,
    (d) first coupling means connecting said signal output circuits of said internal stimulus generator means internally within the chip to said data processing chain at at least one intermediate point along said chain so that said generator predetermined signal pattern is injected into said data processing chain when said generator means is activated by said generator supervisory control means,
    (e) second coupling means including at least a first part which connects said supervisory control means control signals output means internally within the chip to said internal stimulus generator control means effective for operating said control means to activate said generator means.

2. An electronic circuit as described in claim 1, further including fault detector means within the chip having input circuits and output circuits, said input circuits being internally coupled to and effective to monitor said data processing chain, said internal stimulus generator means and said internal stimulus generator supervisory control means, said fault detector means being effective to generator fault signals at the said output circuits upon the occurrence of a fault in the operation of said data processing chain, upon the occurrence of a fault in the operation of said internal stimulus generator means, and upon the occurrence of a fault in the operation of said internal stimulus generator supervisory control means.

3. An electronic circuit as described in claim 1 further including fault detector means within the chip having input circuits and output circuits, said input circuits being internally coupled to and effective to monitor said internal stimulus generator means, and effective to generate fault signals at the said output circuits upon the occurrence of a fault in the operation of said internal stimulus generator means.

4. An electronic circuit as described in claim 3 wherein said fault detector means monitors the accuracy of the said signal pattern at the said signal output circuits of said internal stimulus generator means.

5. An electronic circuit as described in claim 3 further including additional fault detector means within the chip having input circuits and output circuits, said input circuits being internally coupled to and effective to monitor said internal stimulus generator supervisory control means, and effective to generate fault signals at the said output circuits upon the occurrence of a fault in the operation of said internal stimulus generator supervisory control means.

6. An electronic circuit as described in claim 1 further including fault detector means within the chip having input circuits and output circuits, said input circuits being internally coupled to and effective to monitor said internal stimulus generator supervisory control means, and effective to generate fault signals at the said output circuits upon the occurrence of a fault in the operation of said internal stimulus generator supervisory control means.

7. An electronic circuit as described in claim 6 wherein said fault detector means monitors the accuracy of the said control signals at said control signals output means.

8. An electronic circuit as described in claim 1 further including fault detector means within the chip having input circuits and output circuits, said input circuits being internally coupled to and effective to monitor said data processing chain, and effective to generate fault signals at the said output circuits upon the occurrence of a fault in the operation of said data processing chain.

9. An electronic circuit as described in claim 1 further including,
    (a) first fault detector means within the chip having an input circuit and an output circuit, said input circuit being internally coupled to and effective to monitor said data processing chain, and effective to generate fault signals at the said output circuit upon the occurrence of a fault in the operation of said data processing chain,
    (b) second fault detector means within the chip having an input circuit and an output circuit, said input circuit being internally coupled to and effective to monitor said internal stimulus generator means, and effective to generate fault signals at the said output circuit upon the occurrence of a fault in the operation of said internal stimulus generator means, and
    (c) third fault detector means within the chip having an input circuit and an output circuit, said input circuit being internally coupled to and effective to monitor said internal stimulus generator supervisory control means, and effective to generate fault signals at the said output circuit upon the occurrence of a fault in the operation of said internal stimulus generator supervisory control means.

10. An electronic circuit as described in claim 1 wherein
   (a) said data processing chain includes first signal path connections for enabling said data processing chain to normally process data in a parallel load mode, and includes second signal path connections for enabling said data processing chain to process data in a serial load mode, and
   (b) said first coupling means connects said internal stimulus generator means signal output circuits to at least some of said second signal path connections of said data processing chain.

11. An electronic circuit as described in claim 10 wherein
   said second coupling means includes a second part which connects said supervisory control means control signals output means to at least some points in said data processing chain.

12. An electronic circuit as described in claim 11, further including fault detector means within the chip having input circuits and output circuits, said input circuits being internally coupled to and effective to monitor said data processing chain, said internal stimulus generator means and said internal stimulus generator supervisory control means, said fault detector means being effective to generator fault signals at the said output circuits upon the occurrence of a fault in the operation of said data processing chain, upon the occurrence of a fault in the operation of said internal stimulus generator means, and upon the occurrence of a fault in the operation of said internal stimulus generator supervisory control means.

13. An electronic circuit as described in claim 11 further including,
   (a) first fault detector means within the chip having input circuits and output circuits, said input circuits being internally coupled to and effective to monitor said data processing chain, and effective to generator fault signals at the said output circuits upon the occurrence of a fault in the operation of said data processing chain,
   (b) second fault detector means within the chip having input circuits and output circuits, said input circuits being internally coupled to and effective to monitor said internal stimulus generator means, and effective to generate fault signals at the said output circuits upon the occurrence of a fault in the operation of said internal stimulus generator means, and
   (c) third fault detector means within the chip having input circuits and output circuits, said input circuits being internally coupled to and effective to monitor said internal stimulus generator supervisory control means, and effective to generate fault signals at the said output circuits upon the occurrence of a fault in the operation of said internal stimulus generator supervisory control means.

14. An electronic circuit as described in claim 10 further including,
   (a) first fault detector means within the chip having input circuits and output circuits, said input circuits being internally coupled to and effective to monitor said data processing chain, and effective to generator fault signals at the said output circuits upon the occurrence of a fault in the operation of said data processing chain,
   (b) second fault detector means within the chip having input circuits and output circuits, said input circuits being internally coupled to and effective to monitor said internal stimulus generator means, and effective to generate fault signals at the said output circuits upon the occurrence of a fault in the operation of said internal stimulus generator means, and
   (c) third fault detector means within the chip having input circuits and output circuits, said input circuits being internally coupled to and effective to monitor said internal stimulus generator supervisory control means, and effective to generate fault signals at the said output circuits upon the occurrence of a fault in the operation of said internal stimulus generator supervisory control means.

15. An electronic circuit as described in claim 10, further including fault detector means within the chip having input circuits and output circuits, said input circuits being internally coupled to and effective to monitor said data processing chain, said internal stimulus generator means and said internal stimulus generator supervisory control means, said fault detector means being effective to generate fault signals at the said output circuits upon the occurrence of a fault in the operation of said data processing chain, upon the occurrence of a fault in the operation of said internal stimulus generator means, and upon the occurrence of a fault in the operation of said internal stimulus generator supervisory control means.

16. An electronic circuit as described in claim 1 wherein said internal stimulus generator means and first and second coupling means are each plural, the plural signal output circuits of said plural internal stimulus generator means being connected internally to plural points in said data processing chain by said plural first coupling means, and the plural control means of said plural internal stimulus generator means being connected internally to said supervisory control means control signals output means by said plural second coupling means.

17. An electronic circuit as described in claim 16 wherein
   (a) said data processing chain includes first signal path connections for enabling said data processing chain to normally process data in a parallel load mode, and includes second signal path connections for enabling said data processing chain to process data in a serial load mode, and
   (b) said first coupling means connects said internal stimulus generator means signal output circuits to at least some of said second signal path connections of said data processing chain.

18. An electronic circuit as described in claim 17 further including,
   (a) first fault detector means within the chip having input circuits and output circuits, said input circuits being internally coupled to and effective to monitor said data processing chain, and effective to generate fault signals at the said output circuits upon the occurrence of a fault in the operation of said data processing chain,
   (b) second fault detector means within the chip having input circuits and output circuits, said input circuits being internally coupled to and effective to monitor said internal stimulus generator means, and effective to generate fault signals at the said output circuits upon the occurrence of a fault in the operation of said internal stimulus generator means, and (c) third fault detector means within the chip having input circuits and output circuits, said input circuits being internally coupled to and effective to monitor said internal stimulus generator supervisory control means, and effective to generate fault signals at the said output circuits upon the occurrence of a fault in the operation of said internal stimulus generator supervisory control means.

19. An electronic circuit as described in claim 17 further including fault detector means within the chip having input circuits and output circuits, said input circuits being internally coupled to and effective to monitor said data processing chain, said internal stimulus generator means and said internal stimulus generator supervisory control means, said fault detector means being effective to generate fault signals at the said output circuits upon the occurrence of a fault in the operation of said data processing chain, upon the occurrence of a fault in the operation of said internal stimulus generator means and upon the occurrence of a fault in the operation of said internal stimulus generator supervisory control means.

20. An electronic circuit as described in claim 17 wherein said second coupling means includes a second part which connects said supervisory control means control signals output means to at least some points in said data processing chain.

21. An electronic circuit as described in claim 20 further including fault detector means within the chip having input circuits and output circuits, said input circuits being internally coupled to and effective to monitor said data processing chain, said internal stimulus generator means and said internal stimulus generator supervisory control means, said fault detector means being effective to generate fault signals at the said output circuits upon the occurrence of a fault in the operation of said data processing chain, upon the occurrence of a fault in the operation of said internal stimulus generator means and upon the occurrence of a fault in the operation of said internal stimulus generator supervisory control means.

22. An electronic circuit as described in any of claims 1, 16, 9, 13, or 20 wherein said supervisory control means actuating means is actuatable by means external to said chip.

23. An electronic circuit as described in any of claims 3, 6, 8, 9, 4, 5, 7, 13, 14, 2, 12, 15 18, 20, 19, or 21 further including an error encoding circuit within the chip having a plurality of input circuits and an output circuit, the output circuits of said fault detector means being coupled within the chip to separate ones of said plurality of input circuits of said error encoding circuit, and said error encoding circuit being effective responsive to receipt of fault signals from said fault detector means to generate at its output circuit encoded error signals designating the sources of errors in said integrated circuit chip.

24. An electronic circuit as described in claim 13 further including additional integrated circuit chips as described in claim 13 which all together comprise a plurality of integrated circuit chips interconnected in a group by an additional error encoding circuit having a plurality of input circuits and an output circuit, the output circuits of the error encoding circuit of each chip being coupled to separate ones of said plurality of input circuits of said additional error encoding circuit, and said additional error encoding circuit being effective responsive to receipt of encoded error signals from said chips error encoding circuits to generate at its output circuit encoded signals designating the sources of errors in said plurality of integrated circuit chips.

25. An electronic circuit as described in claim 24 further including a plurality of groups of integrated circuit chips as described in claim 24 interconnected by a further error encoding circuit having a plurality of input circuits and an output circuit, the output circuits of said additional error encoding circuits being coupled to separate ones of said plurality of input circuits of said further error encoding circuits, and said further error encoding circuit being effective responsive to receipt of encoded error signals from said additional error encoding circuits to generate at its output circuit encoded signals designating the sources of errors in said plurality of groups of integrated circuit chips.

26. An integrated circuit chip comprising internally in combination,
 (a) first and second data processing chains each having an externally connectible input circuit and an externally connectible output circuit,
 (b) first and second internal stimulus generator means respectively having first and second signal output circuits and first and second control means coupled to and operable for activating said first and second generator means to cause said generator means to produce predetermined signal patterns at the said generator means first and second signal output circuits,
 (c) first and second internal stimulus generator supervisory control means each having actuating means and first and second control signals output means, said actuating means being coupled to said first and second control signals output means and being effective when actuated to produce sequences of control signals at said first and second control signals output means,
 (d) first coupling means respectively connecting said first and second signal output circuits of said first and second internal stimulus generator means internally within the chip to said first and second data processing chains at intermediate points along said chains so that said first and second generator means predetermined signal patterns are injected into said first and second data processing chains when said first and second generator means are activated by said first and second supervisory control means,
 (e) second coupling means respectively connecting said first and second supervisory control means first and second control signals output means internally within the chip to said first and second internal stimulus generator first and second control means effective for operating said first and second control means to activate said first and second generator means.

27. An integrated circuit chip as described in claim 26 wherein each of said first and second internal stimulus generator means and first and second coupling means is plural, the plural signal output circuits of said plural first and second internal stimulus generator means being respectively connected internally to plural points in said first and second data processing chains by said plural first coupling means, and the plural first and second control means of said plural first and second internal stimulus generator means being respectively connected internally to said first and second supervisory control means first and second control signals output means by said plural second coupling means.

28. An integrated circuit chip as defined in claim 26 or 27 further including within the chip at least one comparator fault detector circuit having,
   (a) a first input circuit internally coupled to one point of said first processing chain for receiving signals therefrom,
   (b) a second input circuit internally coupled to a comparable logic point of said second processing chain for receiving signals therefrom, and,
   (c) an output circuit, said at least one comparator circuit producing at its output circuit a first signal indicating the occurrence of an error when the input signals to the said comparator represent different data and producing at its output circuit a second signal when the input signals to the said comparator represent the same data.

29. Integrated circuit chips as defined in claim 28 wherein the functional logic of said second data processing chain is a duplicate of the functional logic of said first data processing chain.

30. Integrated circuit chips as defined in claim 28 wherein the functional logic of said second data processing chain is the duplicate complementary logic to the functional logic of said first data processing chain.

31. Integrated circuit chips as defined in claim 26 or 27 wherein the functional logic of said second data processing chain is a duplicate of the functional logic of said first data processing chain.

32. Integrated circuit chips as defined in claim 26 or 27 wherein the functional logic of said second data processing chain is the duplicate complementary logic to the functional logic of said first data processing chain.

* * * * *